(12) United States Patent
Golda

(10) Patent No.: US 7,159,719 B2
(45) Date of Patent: Jan. 9, 2007

(54) THERMOPHORETIC PROTECTION OF RETICLES

(75) Inventor: Janice M. Golda, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/631,170

(22) Filed: Jul. 31, 2003

(65) Prior Publication Data

US 2005/0023187 A1 Feb. 3, 2005

(51) Int. Cl.
*B65D 85/30* (2006.01)
*B65D 85/00* (2006.01)
*F25D 3/08* (2006.01)

(52) U.S. Cl. .................. 206/524.4; 206/454; 206/701; 62/457.1

(58) Field of Classification Search .............. 206/205, 206/701–728, 524.4, 454, 832; 62/457.1; 211/41.18
See application file for complete search history.

(56) References Cited

U.S. PATENT DOCUMENTS

| | | | | |
|---|---|---|---|---|
| 2,467,268 A | * | 4/1949 | Merkle | 206/205 |
| 5,061,444 A | * | 10/1991 | Nazaroff et al. | 422/40 |
| 5,294,261 A | * | 3/1994 | McDermott et al. | 134/7 |
| 5,405,000 A | * | 4/1995 | Hagedon et al. | 206/216 |
| 5,979,173 A | * | 11/1999 | Tyree | 62/388 |
| 6,153,044 A | * | 11/2000 | Klebanoff et al. | 156/345.3 |
| 6,247,599 B1 | * | 6/2001 | Cheng et al. | 206/723 |
| 6,543,617 B1 | * | 4/2003 | Angelopoulos et al. | 206/701 |
| 2002/0014158 A1 | * | 2/2002 | Page et al. | 95/289 |

* cited by examiner

*Primary Examiner*—Mickey Yu
*Assistant Examiner*—J. Gregory Pickett
(74) *Attorney, Agent, or Firm*—Trop, Pruner & Hu, P.C.

(57) ABSTRACT

A thermophoretic source may be contained within the packaging of a reticle during transport or otherwise to protect the reticle from particle contamination. For example, in advanced lithography technologies, very small particles may be thermophoretically attracted away from the reticle during transport so that cleaning on arrival may not be necessary in some cases.

19 Claims, 1 Drawing Sheet

THERMOPHORETIC PROTECTION OF RETICLES

BACKGROUND

This invention relates generally to protecting reticles from particle contamination, for example during transportation.

Reticles are patterned devices that can be exposed to transfer a pattern on the reticle to a semiconductor structure. Through the use of reticles, patterns may be repeatedly transferred to semiconductor structures in an automated process. This greatly reduces the cost of forming integrated circuits.

Reticles are transported in a shipping container. Physical protection is provided by a shipping box. The reticle carrier that actually carries the reticle may be contained within an antistatic bag.

Conventional packaging is sufficient for optical reticles whose minimum printable particle size is roughly 30 microns. In such case, any particle smaller than 30microns would not adversely affect the operation of the reticle.

However, with certain advanced lithography reticles, such as extreme ultraviolet (EUV) reticles, the technology is capable of resolving particles on the reticle that are much smaller than 30 microns. In these technologies, it is desirable to maintain the reticle free of particles greater than 30 to 50 nanometers in size.

Current mechanical protection methods may be inadequate to prevent small particles from landing on the reticles. If particles landing on the reticle are large enough to adversely affect the transfer of the pattern from the reticle to the semiconductor structure, the reticle must be cleaned. Effective techniques for removing such small particles are largely unproven.

Thus, there is a need for better ways to remove particles from reticles.

DETAILED DESCRIPTION

Figure 1:
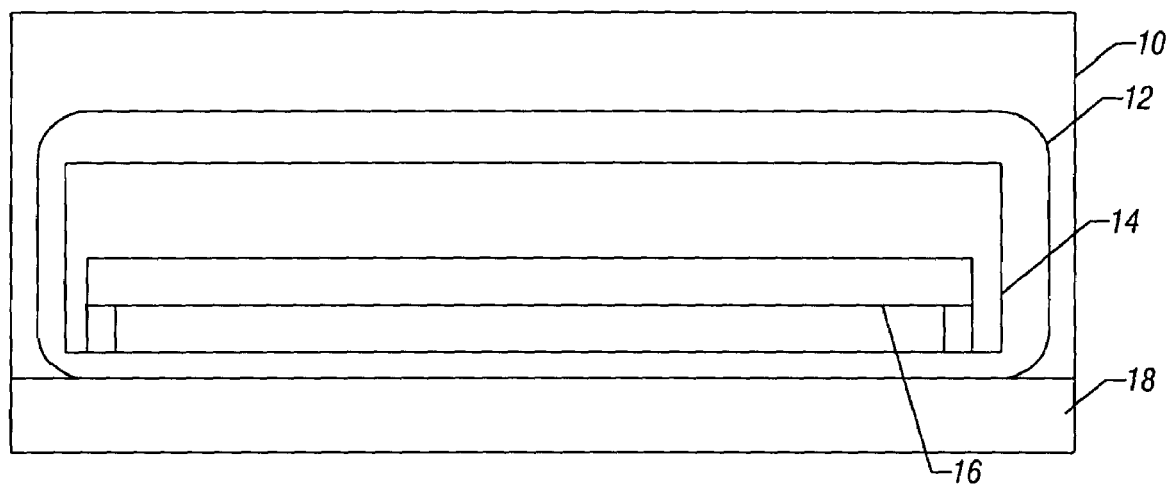
FIG. 1 is an enlarged cross-sectional view of one embodiment of the present invention.

Referring to FIG. 1, a shipping box 10 may enclose one or more packages 12. Each package 12 may, in one embodiment, be an antistatic bag that carries one or more reticle carriers 14. Each reticle carrier 14 may contain one or more reticles 16.

Also included within the box 10 is a self-contained thermophoretic source 18. By self-contained, it is intended to refer to the fact that a power supply is not needed. It is desirable to make the thermophoretic source 18 self-contained to facilitate transport of the box 10.

Thermophoresis is a process whereby particles are attracted to colder temperatures and repelled from warmer temperatures. Thus, particles inside the package 12 will be attracted to the thermophoretic source 18 and away from the reticle 16.

Thermophoresis is a non-continuum effect. The gas mean free path must be comparable or larger than the particle diameter for thermophoresis to occur. A temperature gradient causes a particle motion away from higher temperature and towards lower temperatures. Molecules in a higher temperature region contribute more momentum to particles than molecules in the lower temperature region.

Suitable thermophoresis sources include dry ice and Peltier or thermoelectric coolers. The thermophoretic source 18 generates a temperature gradient between the reticle 16 and the source 18 during transportation to provide thermophoretic protection of the reticle 16. In one embodiment, the thermophoretic source 18 in the form of dry ice may be contained within its own packaging so as to protect the remaining contents of the box 10 from the dry ice material.

Once the thermophoretic force drives particles to cooler surfaces, the particles may be bound to those surfaces by Van der Waal forces or by charge attraction. Cooling the reticle carrier 14 to a temperature below that of the reticle 16 drives contaminating particles away from the reticle 16 and towards the cooler surfaces closer to the thermophoretic source 18.

Thus, in one embodiment, the thermophoretic source 18 may be positioned under the reticle carrier 14. In other embodiments, other positions for the thermophoretic source 18 may be utilized. For example, in some embodiments, the source 18 may be contained within the bag 12.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing a reticle on a carrier and inside an antistatic bag; and
providing a self-contained thermophoretic source to protect said reticle from particle contamination, said thermophoretic source provided under said carrier and external to said carrier.

2. The method of claim 1 wherein providing a self-contained thermophoretic source includes providing dry ice.

3. The method of claim 2 wherein providing a self-contained thermophoretic source includes providing the source and the reticle within a container.

4. The method of claim 1 wherein providing a self-contained thermophoretic source includes providing a Peltier source.

5. The method of claim 1 including providing a source for a reticle that has a printable particle size less than 30 microns.

6. The method of claim 3 including providing the thermophoretic source and the reticle within the same container.

7. The method of claim 3 including providing the reticle within an electrostatic bag and providing the thermophoretic source external to the electrostatic bag.

8. A method comprising:
providing a reticle on a carrier within an antistatic bag; and
creating a temperature gradient for the reticle within a shipping box to protect said reticle from particle contamination during shipment.

9. The method of claim 8 wherein creating a temperature gradient includes creating a temperature gradient for a plurality of reticles within the shipping box.

10. The method of claim 9 wherein creating a temperature gradient includes creating a temperature gradient for a plurality of reticles within a reticle carrier.

11. The method of claim 8 including separating the source of the temperature gradient from the reticle.

12. The method of claim 8 wherein creating a temperature gradient includes creating a temperature gradient using a thermophoretic source that does not require a power supply.

13. The method of claim 12 wherein using a thermophoretic source that does not require a power supply includes using dry ice.

14. The method of claim 8 wherein creating a temperature gradient includes creating a temperature gradient using a thermoelectric coupling device.

15. The method of claim 8 wherein creating a temperature gradient includes creating a temperature gradient using the Peltier effect.

16. A method comprising:
providing a reticle in an antistatic bag and a shipping container; and
providing a thermophoretic source that does not require an external power supply in the shipping container, the thermophoretic source to create a temperature gradient within the shipping container, the temperature gradient to prevent particles from contaminating said reticle during shipment.

17. The method of claim 16 wherein providing a thermophoretic source in the shipping container includes providing dry ice within the shipping container.

18. A method comprising:
providing a reticle on a carrier and inside an antistatic bag; and
providing a self-contained thermophoretic source external to said carrier, said thermophoretic source positioned with respect to said carrier to create a temperature gradient that protects said reticle from particle contamination.

19. The method of claim 18 including wherein providing a self-contained thermophoretic source includes providing the source and the reticle within a container.

* * * * *